United States Patent
Donders et al.

(10) Patent No.: US 6,480,260 B1
(45) Date of Patent: Nov. 12, 2002

(54) MASK CLAMPING APPARATUS, E.G. FOR A LITHOGRAPHIC APPARATUS

(75) Inventors: Sjoerd N. L. Donders, 's-Hertogenbosch (NL); Tjarko A. R. van Empel, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/721,741

(22) Filed: Nov. 27, 2000

(30) Foreign Application Priority Data

Dec. 3, 1999 (EP) .............................. 99204103

(51) Int. Cl.⁷ .................. G03B 27/42; G03B 27/58; G03B 27/60; A61N 5/00; G03C 5/00
(52) U.S. Cl. .................. 355/53; 355/72; 355/73; 355/74; 355/75; 355/76; 355/77; 250/492.2; 250/492.22; 430/311
(58) Field of Search ................. 355/53, 72, 73, 355/74, 75, 76, 77; 250/492.2, 492.22; 430/311

(56) References Cited

U.S. PATENT DOCUMENTS

| | | | | |
|---|---|---|---|---|
| 4,716,299 A | * | 12/1987 | Tanaka et al. ............... | 250/571 |
| 4,749,867 A | * | 6/1988 | Matsushita et al. ...... | 250/440.1 |
| 5,137,349 A | * | 8/1992 | Taniguchi et al. .......... | 353/122 |
| 6,118,515 A | * | 9/2000 | Wakamoto et al. ........... | 355/53 |

FOREIGN PATENT DOCUMENTS

| | | | | |
|---|---|---|---|---|
| JP | 7-192984 | | 7/1995 | |
| JP | 07192984 | * | 9/1995 | ........... H01L/21/30 |
| JP | 8-167553 | | 6/1996 | |

* cited by examiner

*Primary Examiner*—William Dowling
*Assistant Examiner*—Khaled Brown
(74) *Attorney, Agent, or Firm*—Pillsbury Winthrop LLP

(57) ABSTRACT

An apparatus for supporting a mask comprises a pair of members. The mask held against each member by a vacuum arrangement which prevents relative motion between the mask and members. The members are compliant such that they accommodate flatness variations in the mask but without deforming the mask.

26 Claims, 4 Drawing Sheets

MASK CLAMPING APPARATUS, E.G. FOR A LITHOGRAPHIC APPARATUS

BACKGROUND OF THE INVENTION

1. Field of the Invention

The present invention relates to a lithographic projection apparatus comprising:

a radiation system for supplying a projection beam of radiation;

a first object table for holding a mask;

a second object table for holding a substrate; and a projection system for imaging an irradiated portion of the mask onto a target portion of the substrate.

More particularly, the invention relates to a mask table for use in such apparatus.

2. Description of the Related Art

For the sake of simplicity, the projection system may hereinafter be referred to as the "lens"; however, this term should be broadly interpreted as encompassing various types of projection system, including refractive optics, reflective optics, catadioptric systems, and charged particle optics, for example. The radiation system may also include elements operating according to any of these principles for directing, shaping or controlling the projection beam of radiation, and such elements may also be referred to below, collectively or singularly, as a "lens". In addition, the first and second object tables may be referred to as the "mask table" and the "substrate table", respectively. Further, the lithographic apparatus may be of a type having two or more mask tables and/or two or more substrate tables. In such "multiple table" devices the additional tables may be used in parallel, or preparatory steps may be carried out on one or more stages while one or more other stages are being used for exposures. Twin stage lithographic apparatus are described in International Patent Applications WO 98/28665 and WO 98/40791, for example.

Lithographic projection apparatus can be used, for example, in the manufacture of integrated circuits (ICs). In such a case, the mask (reticle) may contain a circuit pattern corresponding to an individual layer of the IC, and this pattern can be imaged onto a target portion (comprising one or more dies) on a substrate (silicon wafer) which has been coated with a layer of photosensitive material (resist). In general, a single wafer will contain a whole network of adjacent target portions which are successively irradiated via the mask, one at a time. In one type of lithographic projection apparatus, each target portion is irradiated by exposing the entire mask pattern onto the target portion at once; such an apparatus is commonly referred to as a wafer stepper. In an alternative apparatus—which is commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned from International Patent Application WO 97/33205.

In the above apparatus, the mask must be securely held ("clamped") so that it can be accurately positioned in the x, y and z direction and in rotational orientation about the x, y and z axes (referred to as the Rx, Ry and Rz directions). The z direction is defined as being the direction along an axis which is substantially parallel to the optical axis of the projection system, and the x and y directions are along axes which are substantially perpendicular to the z axis and to each other. The mask can be subjected to large accelerations in its plane (the xy plane), particularly in a step-and-scan apparatus where the acceleration can be around 5 g (where g is the gravitational acceleration). In the z direction, the mask can be positioned with a 100 Hz bandwidth actuator which requires a relatively high stiffness in the z direction. The mask clamping arrangement must be sufficiently secure to withstand such accelerations and also to provide the mask with the necessary stiffness in the xy plane.

However, previous mask clamping arrangements, such as a rigid vacuum clamp on the mask table, have the problem that deformation of the mask can be caused. This can be as a result of either or both of the mask and the vacuum clamp not being perfectly flat or because of contaminant particles being trapped between the mask and the clamp. For example, the mask may only be flat to within a few $\mu$m. The deformation of the mask leads to distortion of the projected image, and variation in distortion between different masks leads to overlay errors. Some deformation can be corrected for by adjustment of one or more lens elements in the apparatus; however, not all distortion can be corrected in this way and the deformation is generally not reproducible between different masks.

An object of the present invention is to provide an improved apparatus for holding a mask which avoids or alleviates the above problems.

According to the present invention there is provided a lithographic projection apparatus for imaging of a mask pattern in a mask onto a substrate provided with a radiation-sensitive layer, the apparatus comprising:

a radiation system for supplying a projection beam of radiation;

a first object table for holding a mask;

a second object table for holding a substrate;

a projection system for imaging irradiated portions of the mask onto target portions of the substrate; wherein:

said mask table comprises at least one compliant member for holding said mask such that said at least one compliant member yields to conform substantially to the profile of the mask.

The use of at least one compliant member enables the mask to be held, but without unwanted deformation by forcing it to adopt a particular shape. The member can yield to accommodate flatness variations in the mask. The member, preferably a membrane, has a stiffness in the xy plane such that thermal expansion of the mask can be accommodated by the flexibility of the member, but without slipping of the mask with respect to the member. Slipping is detrimental to overlay precision, more so than thermal expansion, because of its asymmetric occurrence.

By appropriate choice of material and thickness of the member, its stiffness can be determined such that any particles trapped between the mask and member will preferentially deform the member rather than the mask. This can reduce deflection of the mask caused by a contaminant particle by a factor of as much as 10,000 compared to conventional mask clamping arrangements.

Preferably said at least one member comprises a pair of parallel strips, each of which is supported along its length. This improves the stiffness of the member against sagging, and reduces material creep.

Preferably the apparatus comprises a recess in the member which can function as a vacuum space for holding the mask and the member against each other (see for example FIG. 4). This arrangement is both secure and compact.

Preferably the apparatus comprises a plurality of support points for defining the position of the mask perpendicular to its plane, that is in the z, Rx and Ry directions. The, or each, member defines the x, y and Rz position of the mask, and support points define the remaining position of the mask without distorting it into a particular shape. Three support points define a plane, so are the minimum number needed without over-constraining the position of the mask. A fourth support point can also be provided to give more stability and stiffness, but preferably the fourth support point is, for example, a damped gas bearing to eliminate vibrations of the mask.

Preferably the apparatus further comprises a vacuum chamber in a table supporting said at least one member, for deforming the member. By bending the member down into the vacuum chamber a couple will be introduced on the mask supported on the opposite edge of the member which will compensate against sagging of the mask.

Preferably a gas cushion is provided for supporting said at least one member; such a cushion may be of the order of 10 $\mu$m thick, for example. The gas (such as air) in the cushion supports the member, preferably a membrane, whilst allowing flatness variations. It also damps the member and mask held thereon against vibrations, whilst still providing adequate stiffness in the z direction. The gas cushion also improves the thermal conductivity between the supported mask and the table. This can be important because it enables heat arising from the incidence of radiation on the mask to be conducted away from the mask.

Preferably the or each member is made of one or more materials selected from metal, silica ($SiO_x$), $CaF_2$, $MgF_2$, $BaF_2$, $Al_2O_3$ and Zerodur® (trademark) ceramic. Most of these materials can enable the member to be made of the same material as the mask. This has the advantage that the mask and member can then have the same mechanical properties, such as coefficient of thermal expansion, and, therefore, further reduces distortion and creep.

According to a further aspect of the invention there is provided a method of manufacturing a device using a lithographic projection apparatus comprising:

a radiation system for supplying a projection beam of radiation;

a first object table for holding a mask;

a second object table for holding a substrate; and a projection system for imaging irradiated portions of the mask onto target portions of the substrate; the method comprising the steps of:

providing a mask bearing a pattern to said first object table;

providing a substrate provided with a radiation-sensitive layer to said second object table; and irradiating portions of the mask and imaging said irradiated portions of the mask onto said target portions of said substrate, characterised by the step of:

holding said mask, during operation, on said mask table with the aid of at least one compliant member such that said at least one compliant member yields to conform substantially to the profile of the mask.

In a manufacturing process using a lithographic projection apparatus according to the invention a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallisation, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

BRIEF DESCRIPTION OF THE DRAWINGS

In the present document, the terms illumination radiation and illumination beam are used to encompass all types of electromagnetic radiation or particle flux, including, but not limited to, ultraviolet radiation (e.g. with a wavelength of 365, 248, 193, 257 or 126 nm), EUV, X-rays, electrons and ions.

Embodiments of the invention will now be described, by way of example only, with reference to the accompanying drawings in which.

DETAILED DESCRIPTION OF THE INVENTION

Figure 1:
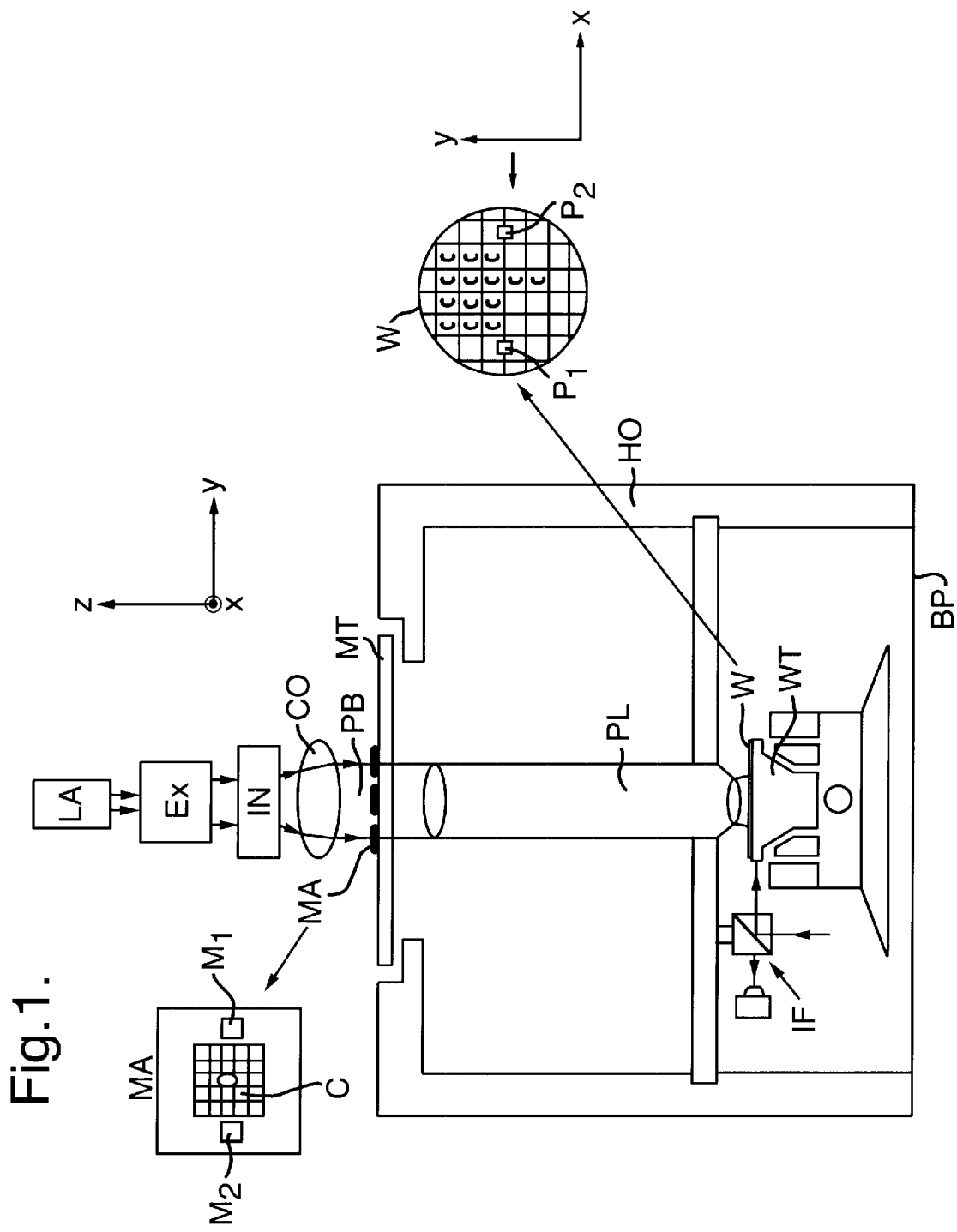
FIG. 1 depicts a lithographic projection apparatus according to a first embodiment of the invention.

FIG. 1 schematically depicts a lithographic projection apparatus according to the invention. The apparatus comprises:

a radiation system LA, Ex, IN, CO for supplying a projection beam PB of radiation;

a first object table (mask table) MT for holding a mask MA (e.g. a mask), and connected to first positioning means for accurately positioning the mask with respect to item PL;

a second object table (substrate table) WT for holding a substrate W (e.g. a resist-coated silicon wafer), and connected to second positioning means for accurately positioning the substrate with respect to item PL;

a projection system ("lens") PL (e.g. a refractive or catadioptric system, a mirror group or an array of field deflectors) for imaging an irradiated portion of the mask MA onto a target portion C (comprising one or more dies) of the substrate W. As here depicted, the apparatus is of a transmissive type (i.e. has a transmissive mask). However, in general, it may also be of a reflective type, for example.

The radiation system comprises a source LA (e.g. a Hg lamp, excimer laser, an undulator provided around the path of an electron beam in a storage ring or synchrotron, or an electron or ion beam source) which produces a beam of radiation. This beam is caused to traverse various optical components comprised in the illumination system,—e.g. beam shaping optics Ex, an integrator IN and a condenser CO—so that the resultant beam PB has a desired shape and intensity distribution in its cross-section.

The beam PB subsequently intercepts the mask MA which is held on a mask table MT. Having passed through the mask MA, the beam PB passes through the lens PL, which focuses the beam PB onto a target portion C of the substrate W. With the aid of the interferometric displacement and measuring means IF, the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long stroke module (course positioning) and a short stroke module (fine positioning), which are not explicitly depicted in FIG. 1. In the case of a wafer stepper (as opposed to a step-and-scan apparatus) the mask table may be connected to a short stroke positioning module only, or it may just be fixed. The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given reference direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
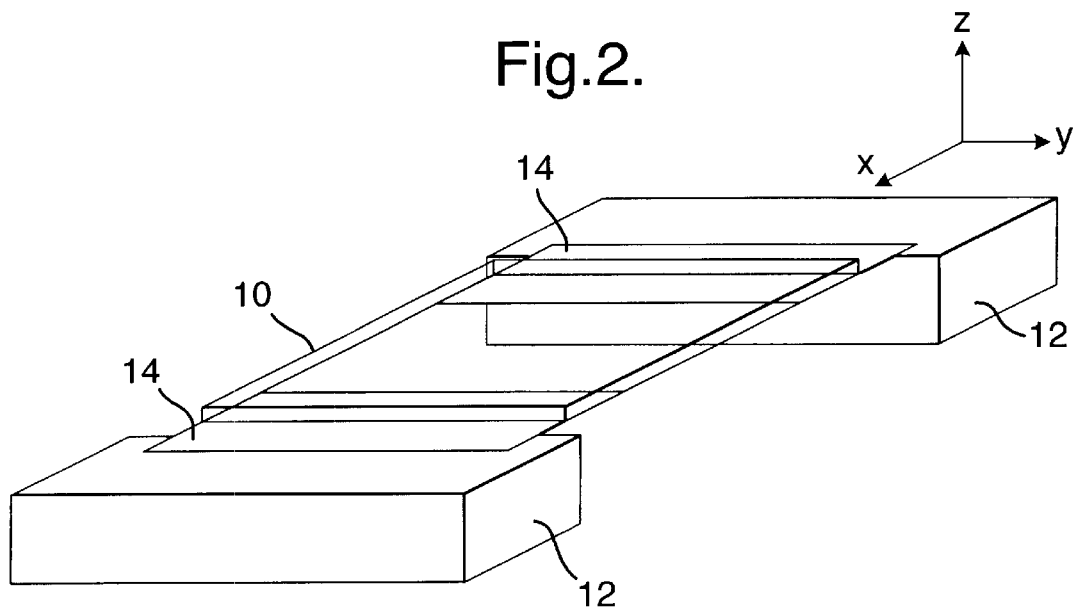
FIGS. 2 and 3 are schematic illustrations of two arrangements for supporting a mask on a mask table using members according to the invention.
Figure 3:
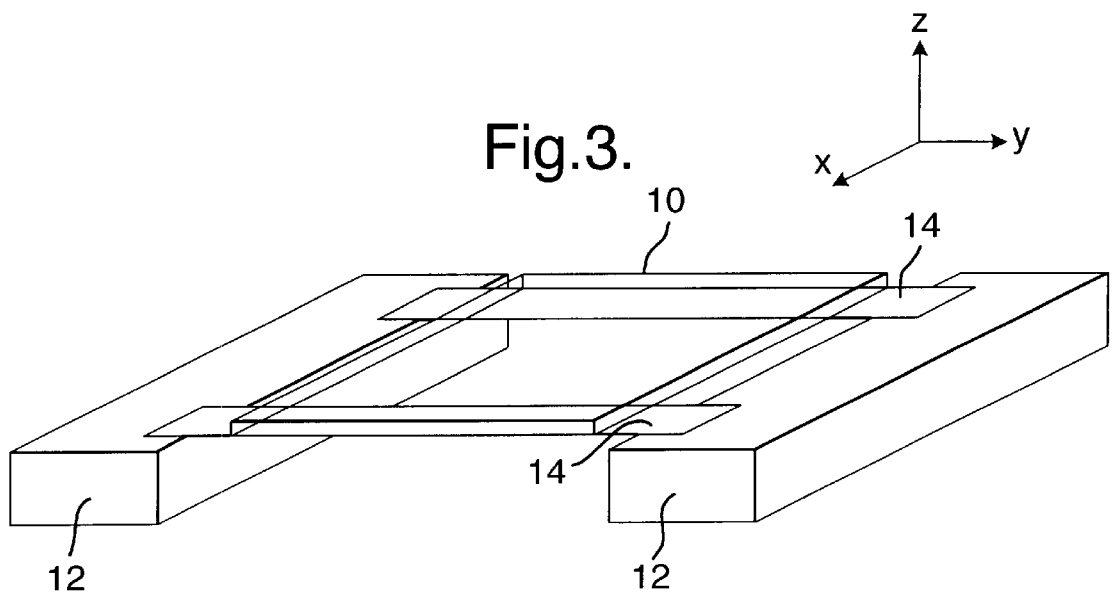

FIGS. 2 and 3 illustrate two arrangements for supporting a mask (reticle) 10 on parts 12 of the mask table by means of a pair of members 14. In FIG. 2, two opposite edges of the reticle 10 are supported on portions of the members 14 which are cantilevered from the edges of opposing parts 12 of the mask table; in the case of a transmissive mask, as here, a space is provided between the parts 12, enabling the projection beam to traverse the mask table. Alternatively, as shown in FIG. 3, the reticle can be supported on a pair of parallel members 14 which are each supported on parts 12 at each of their ends. The arrangement of FIG. 2 is generally preferred because the strip-shaped members 14 are supported on parts 12 along their length in the y direction, and therefore have a higher stiffness to reduce sagging of the reticle. In case of a reflective mask, it is preferred to employ a membrane which supports said reflective mask (almost) completely. In all cases the members are compliant such that they yield to the shape of the reticle 10 without deforming it by force to adopt a particular configuration.

In the illustrated embodiments, the members 14 may be made of the same material as the reticle, such as silica, $CaF_2$, $MgF_2$, $BaF_2$, $Al_2O_3$ and Zerodur® ceramic, for example. However, other possibilities are contemplated, such as supporting the reticle on baths of gel, for example, or making the member (partly) out of metal.

In the case of a quartz (a crystalline form of silica) member, the member thickness will typically be approximately 250 μm. The length of each member 14 is preferably substantially equal to the length of the reticle 10, for example 100 to 200 mm long. Referring to FIG. 2, the distance that the long edge of each member 14 is cantilevered beyond the respective edge of part 12 is typically 25 mm in total. Of this, the distance from the edge of the part 12 to the edge of the reticle 10 can be approximately 10 mm, for example, and the width of the overlap of the reticle 10 and member 14 may be approximately 15 mm, for example.

Figure 4:
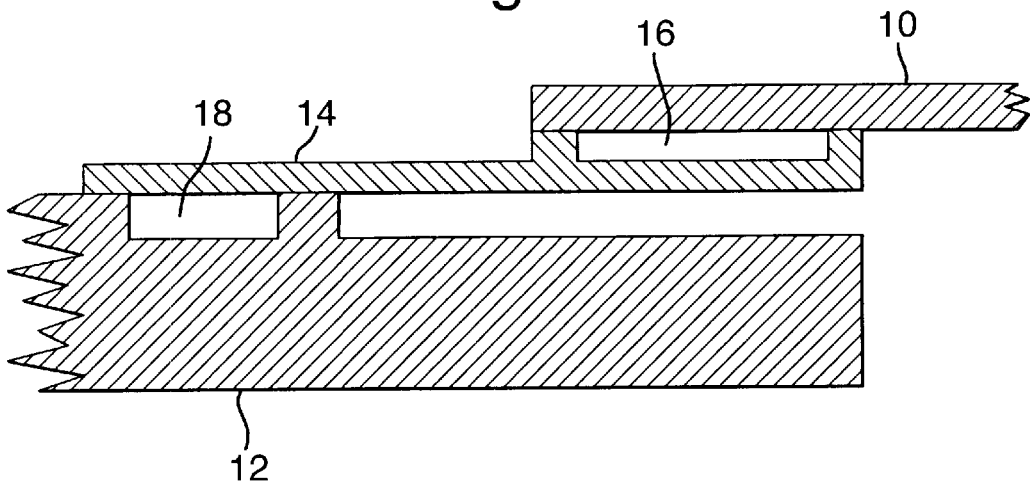
FIG. 4 is a cross-section of part of a mask, member and mask table according to the invention.

The members 14 are primarily to support the reticle in the horizontal sense, in the x, y and Rz directions. FIG. 4 is a schematic cross-section in the xz plane of a portion of the apparatus of FIG. 2 showing the preferred method of clamping the reticle 10 to the member 14 by use of a vacuum space 16. In this embodiment, the vacuum space 16 is formed as a recess in the member 14. The recess may comprise a rectangular depression in the member 14 along substantially its entire length (perpendicular to the plane of the page) with a lip around its edge. Spacers, such as one or more rows of small posts (not shown) can be provided in the vacuum space 16 to prevent the vacuum space 16 from collapsing.

By "vacuum" a reduced gas pressure is of course meant, such as $5.5 \times 10^4$ Pa for example, such that the excess external pressure provides a normal force holding the reticle 10 and the member 14 against each other. Relative motion between the reticle 10 and member 14 in the xy plane is impeded by the friction between the two components, which is increased by the normal force. The coefficient of friction between the member and reticle can, of course, be selected by the choice of material for and/or the roughness of the contact surfaces.

It is also contemplated that the normal force between the reticle 10 and member 14 can be provided by means other than vacuum space 16, such as mechanical clamping between a pair of jaws, magnetic clamping and electrostatic clamping, for example.

FIG. 4 illustrates a vacuum chamber 18, which is a further optional feature of the invention. By evacuating the chamber 18, a resultant force is applied to the member 14 which tends to bend it down into the chamber 18. This introduces a corresponding upward force on the opposite edge of the member 14, on which the reticle 10 is supported, and which therefore reduces sagging of the reticle.

Any other suitable means can be used to hold the member 14 against the part 12, for example, screws or adhesives.

Other arrangements, apart from the vacuum chamber 18, can be used to result in a torsional force being applied to a reticle 10 via members 14 to compensate for sagging of the reticle 10. For example, the member can be pre-stressed such that the free edge stands up slightly. Then, when a reticle is placed on the member, the member bends slightly and exerts a torsional force on the reticle.

Figure 5:
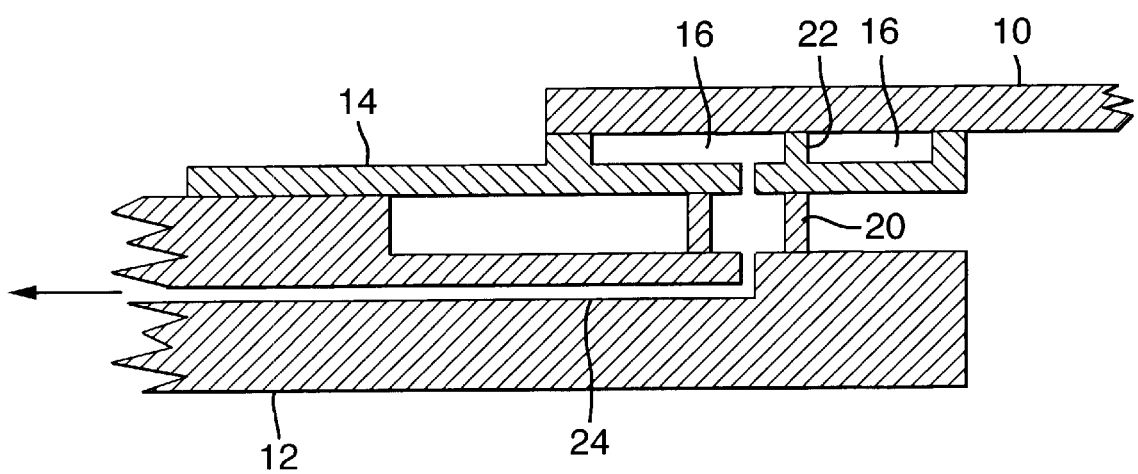
FIG. 5 is a cross-section of part of an apparatus according to the invention showing a support and vacuum supply for a member and mask.

The arrangement of member 14 and reticle 10 described above is sufficient to determine the x, y and Rz position of the reticle. An arrangement for defining the position of the reticle 10 in the z direction is illustrated in FIG. 5. A support 20 is located on the part 12 (of the mask table) and comprises a small post, which may be integrally formed with the part 12. In this example, the underside of the member 14 is in contact with the vertical support 20 and the reticle 10 is in contact with spacers 22 formed in the member 14. In this way, the vertical position of the underside of the reticle 10 is defined at this point. The support 20 can be tubular to enable a vacuum supply duct 24 to communicate with the vacuum space 16. This is a convenient way of evacuating the vacuum space 16, and also provides a vacuum force by which the member 14 and reticle 10 are clamped to the support 20. The spacers 22 are made such that the vacuum duct 24 can evacuate the entire vacuum space 16. In an alternative embodiment, the support 20 may pass through an aperture in the member 14 and directly contact the reticle 10.

To define the plane of the reticle 10, a minimum of three supports 20 must be provided, thereby defining the z position of the reticle 10 at at least three points. The weight of the reticle 10 will almost entirely (e.g. approximately 90%) be carried by the member 14. However, in case the member 14 is not pre-stressed or in case the space between the member 14 and the part 12 is not pressurized, the said supports will carry the weight of the mask predominantly. The function of the reticle supports 20 is generally to determine the z, Rx and Ry positioning. The reticle 10 and member 14 are, of course, free to sag under gravity between the supports 20, however the sagging is reproducible because it is determined purely by gravity acting on the reticle, and it produces a torsional shape which can be substantially corrected by appropriate lens element adjustment, for example.

Defining the z position of the reticle at three support points allows maximum torsional freedom without distortion of the reticle. Referring to FIG. 2, in one preferred arrangement two support points are provided under one of the members 14, one at each end, at or near the corners of the reticle 10. A third support point is provided under the other member 14, either near its middle, or at one end, near a third corner of the reticle 10.

Figure 6:
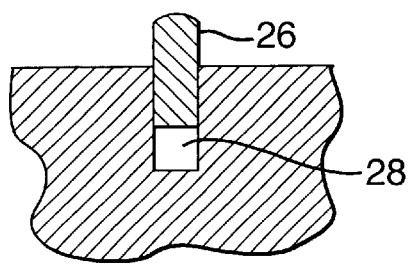
FIG. 6 illustrates, in cross-section, a damped support point for use with the present invention.

According to a further embodiment, a fourth support point is provided to give the reticle more stability and stiffness, and in this case one support point can be provided at each corner of the reticle 10. Four fixed support points would over-determine the reticle and force it to adopt a particular shape. Therefore, the fourth support point is preferably provided by means of a fourth support free to move in the z direction, but biased with a force such that it supports approximately a quarter of the total weight carried by all four supports, i.e. the weight of the reticle 10 is carried substantially equally between the four support points. An example of the fourth support is illustrated in FIG. 6 and comprises a pin 26 and gas space 28. The gas provides the vertical force and also damps the motion, which is important for eliminating vibration of the member and reticle. To this end, the gas can also be replaced by a liquid or gel. Other arrangements, of course, may be used, such as a spring and damper, for example.

Figure 7:
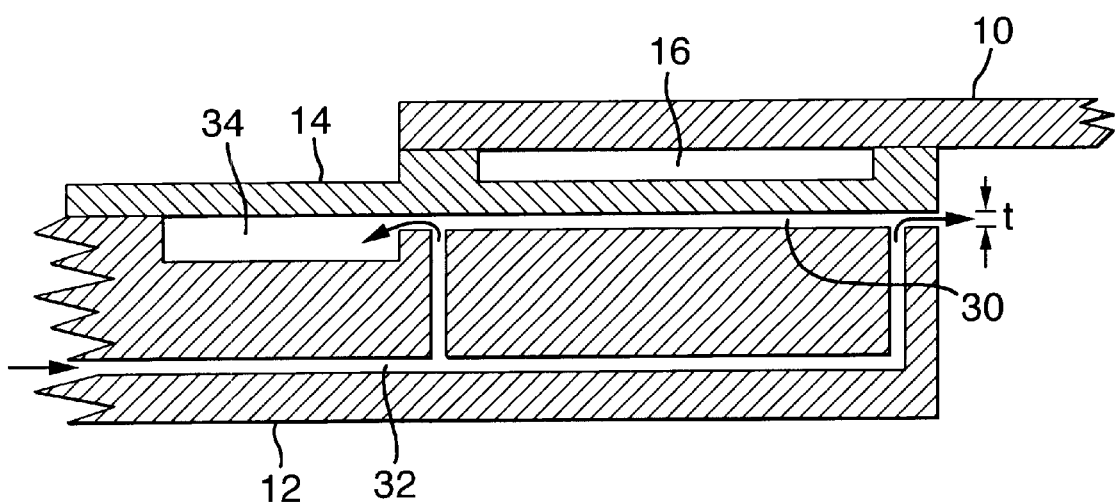
FIG. 7 illustrates, in cross-section, an embodiment of the invention incorporating a gas cushion beneath the member.

A further preferred feature of the invention is illustrated in FIG. 7. A small space 30 is provided between the member 14 and the part 12. A gas supply 32 is connected to the space 30, which acts as a gas cushion. This compensates against reticle sag, and improves thermal conduction between the reticle 10 and the part 12. The thickness t of space 30 forming the cushion is approximately 10 $\mu$m, and, therefore, the gas cannot move very fast under the member 14; consequently, vertical movement of the member 14 is damped, and the gas cushion is substantially stiff in the z direction. The gas supply line 32 can be provided coaxially with the vacuum duct 24, preferably along the border of the gas cushion 30. A duct 34 is provided under the member 14 for outflow of the gas from the cushion. The gas can also flow out under the reticle 10.

The or each member described above does not, of course, have to be in the form of a strip. In another contemplated embodiment, four annular members are provided, which each encircle a support pin or post. The reticle is positioned in the vertical direction by the four supports, one of which is a gas plunger as shown in FIG. 6. The reticle is held in the xy plane by being vacuum clamped to the annular member around each support.

All mask clamping arrangements described above are suitable for holding a mask in such a way as to avoid exerting a force on the mask sufficient to substantially deform it. Generally, however, masks may be deformed intrinsically and, consequently, may deviate substantially in shape from a flat plane; examples of such deviations are wedge-like, parabolic, saddle-shaped and cork-screw-like deformations, etc. Such deformations at mask level will generally lead to undesirable focal plane deviations at wafer level. In a step-andscan apparatus the position of said mask may generally be adjustable (in three degrees of freedom: z, Rx, Ry) during a scan in order to minimize or completely remove the said focal plane deviations. To this end, one or more actuators—which are located so as to enable movement of the mask table and therefore the mask in the z, Rx or Ry directions—are selectively and independently moved. In order to establish the positional correction needed, a "height map" of the mask pattern may be determined. Said height map can be determined by determining the focal plane form/position at wafer level. Said focal plane form/position can be determined either using a technique such as "FOCAL" or, alternatively, one may directly measure the aerial image, e.g. using a Transmission Image Sensor (TIS). Both methods will be described below.

FOCAL is an acronym for FOcus Calibration by using ALignment. It is a best-focus measurement technique for completely determining information about the focal plane using the alignment system of the lithographic apparatus. A special, asymmetrically segmented alignment mark is imaged through focus on to a resist-coated wafer. The position of this imaged mark (latent or developed) can be measured by the said alignment system. Due to the asymmetric segmentation, the position measured by the alignment system will depend on the defocus used during exposure, thus allowing determination of the best-focus position. By distributing these marks over the whole image field and using different orientation for the segmentation, the complete focal plane for several structure orientations can be measured. This technique is described in more detail in U.S. Pat. No. 5,674,650 (P-0052) which is incorporated herein by reference.

One or more transmission image sensor(s) (TIS) can be used to determine the lateral position and best focus position (i.e. vertical and horizontal position) of the projected image from the mask under the projection lens. A transmission image sensor (TIS) is inset into a physical reference surface associated with the substrate table (WT). In a particular embodiment, two sensors are mounted on a fiducial plate mounted to the top surface of the substrate table (WT), at diagonally opposite positions outside the area covered by the wafer W. The fiducial plate is made of a highly stable material with a very low coefficient of thermal expansion, e.g. Invar, and has a flat reflective upper surface which may carry markers used with another fiducial in alignment processes. The TIS is used to determine directly the vertical (and horizontal) position of the aerial image of the projection lens. It comprises apertures in the respective surface close behind which is placed a photodetector sensitive to the radiation used for the exposure process. To determine the position of the focal plane, the projection lens projects into space an image of a pattern provided on the mask MA and having contrasting light and dark regions. The substrate stage is then scanned horizontally (in one or preferably two directions) and vertically so that the aperture of the TIS passes through the space where the aerial image is expected to be. As the TIS aperture passes through the light and dark portions of the image of the TIS pattern, the output of the photodetector will fluctuate (a Moiré effect). The vertical level at which the rate of change of amplitude of the photodetector output is highest indicates the level at which the image of TIS pattern has the greatest contrast and hence indicates the plane of optimum focus. The horizontal level at which the rate of change is highest indicates the aerial image's lateral position. An example of a TIS of this type is described in greater detail in U.S. Pat. No. 4,540,277. Advantages of TIS include robustness and speed because it is a direct measurement technique not involving exposure of a resist.

The above described and illustrated features of embodiments of the invention can be used separately or in combination. The Figures are merely schematic and are not to scale, and the relative dimensions of elements in each Figure are not necessarily to scale with each other, and, for example, the vertical scale in the cross-sectional views has been exaggerated for clarity.

While specific embodiments of the invention have been described above, it will be appreciated that the invention may be practiced otherwise than as described. The description is not intended to limit the invention.

What is claimed is:

1. A lithographic projection apparatus for imaging of a mask pattern in a mask onto a substrate provided with a radiation-sensitive layer, the apparatus comprising:
    a radiation system constructed and arranged to supply a projection beam of radiation;
    a first object table for holding a mask having a stiffness;
    a second object table for holding a substrate;
    a projection system constructed and arranged to image irradiated portions of the mask onto target portions of the substrate;
    said mask table including at least one compliant member constructed and arranged to hold said mask such that said at least one compliant member yields to conform substantially to a profile of the mask, wherein a portion of said at least one compliant member is in direct contact with said mask and said portion has a stiffness lower than the stiffness of the mask.

2. An apparatus according to claim 1, wherein said at least one member comprises a pair of parallel strips.

3. An apparatus according to claim 2, wherein each strip is supported along its length.

4. An apparatus according to claim 2, wherein each strip is supported substantially at each end across its width.

5. An apparatus according to claim 1, further comprising a vacuum space constructed and arranged to hold said mask against said at least one member.

6. An apparatus according to claim 5, wherein said vacuum space comprises a recess in said at least one member.

7. An apparatus according to claim 1, further comprising a plurality of supports defining a position of said mask perpendicular to its plane.

8. An apparatus according to claim 7, wherein each support comprises one of a post and burl.

9. An apparatus according to claim 5, wherein said at least one support comprises a duct in communication with said vacuum space said duct being constructed and arranged to evacuate said vacuum space.

10. An apparatus according to claim 7, comprising three supports, wherein said three supports are arranged to support said mask proximate the middle of one of its sides and proximate two of its corners, opposite said one of its sides.

11. An apparatus according to claim 7, comprising three supports, wherein each support is arranged to support said mask proximate a respective one of its corners.

12. An apparatus according to 7, comprising four supports, wherein each support is arranged to support said mask proximate a respective one of its corners.

13. An apparatus according to claim 12, wherein three of said supports are fixed and a fourth one of said is movable perpendicular to the plane of the mask and is arranged to provide a desired supporting force.

14. An apparatus according to claim 13, wherein said fourth support comprises a spring or gas bearing.

15. An apparatus according to claim 13, wherein said fourth support is damped.

16. An apparatus according to claim 1, wherein said at least one member is arranged to exert a torsional force on said mask for compensating against gravitational sagging of said mask.

17. An apparatus according to claim 1, wherein said at least one compliant member comprises a membrane.

18. An apparatus according to claim 17, further comprising a vacuum chamber in a table supporting said at least one member said vacuum chamber being constructed and arranged to deform said member.

19. An apparatus according to claim 17, wherein said member is pre-stressed.

20. An apparatus according to claim 17, wherein said at least one member is made of one or more materials selected from: metal, silica, $CaF_2$, $MgF_2$ $BaF_2$, $Al_2O_3$ and Zerodur ceramic.

21. An apparatus according to claim 1, further comprising a gas bearing for supporting said at least one member.

22. An apparatus according to claim 1, further comprising a gas cushion for supporting said at least one member.

23. An apparatus according to claim 22, wherein said gas cushion has a thickness in the range of from 5 to 20 $\mu$m.

24. A method of manufacturing a device comprising:
    providing a mask bearing a pattern to a first object table;
    providing a substrate provided with a radiation-sensitive layer to a second object table; and
    irradiating portions of the mask and imaging irradiated portions of the mask onto target portions of said substrate;
    holding said mask, during operation, on said first object table with the aid of at least one compliant member such that said at least one compliant member yields to conform substantially to the profile of the mask, wherein a portion of said at least one compliant member is in direct contact with said mask and said portion has a stiffness lower than the stiffness of the mask.

25. A device manufactured according to the method of claim 24.

26. A mask table comprising at least one compliant member for holding a mask such that said at least one compliant member yields to conform substantially to the profile of the mask, wherein a portion of said at least one compliant member is in direct contact with said mask and said portion has a stiffness lower than the stiffness of the mask.

* * * * *